United States Patent
Lara-Avila et al.

(10) Patent No.: US 11,575,033 B2
(45) Date of Patent: Feb. 7, 2023

(54) ASSEMBLING OF MOLECULES ON A 2D MATERIAL AND AN ELECTRONIC DEVICE

(71) Applicant: GRAPHENSIC AB, Stockholm (SE)

(72) Inventors: Samuel Lara-Avila, Gothenburg (SE); Hans He, Gothenburg (SE); Sergey Kubatkin, Gothenburg (SE)

(73) Assignee: GRAPHENSIC AB, Stockholm (SE)

( * ) Notice: Subject to any disclaimer, the term of this patent is extended or adjusted under 35 U.S.C. 154(b) by 0 days.

(21) Appl. No.: 16/955,188

(22) PCT Filed: Dec. 6, 2018

(86) PCT No.: PCT/SE2018/051257
§ 371 (c)(1),
(2) Date: Jun. 18, 2020

(87) PCT Pub. No.: WO2019/125267
PCT Pub. Date: Jun. 27, 2019

(65) Prior Publication Data
US 2020/0328295 A1    Oct. 15, 2020

(30) Foreign Application Priority Data
Dec. 22, 2017   (SE) ................... 1751625-3

(51) Int. Cl.
*H01L 21/225* (2006.01)
*H01L 29/76* (2006.01)
*H01L 29/66* (2006.01)

(52) U.S. Cl.
CPC ...... *H01L 29/7606* (2013.01); *H01L 21/2254* (2013.01); *H01L 29/66439* (2013.01)

(58) Field of Classification Search
CPC ........... H01L 29/7606; H01L 29/66439; H01L 29/1606; H01L 21/02225; H01L 21/22;
(Continued)

(56) References Cited

U.S. PATENT DOCUMENTS 8,772,141 B2   7/2014   Afzali-Ardakani et al.
8,940,576 B1   1/2015   Bui et al.
(Continued)

FOREIGN PATENT DOCUMENTS

WO        2014021640 A1    2/2014

OTHER PUBLICATIONS

Wehling et al., Molecular doping of graphene (2008), Nano Letters, vol. 8, No. 1, pp. 173-177. (Year: 2008).*
(Continued)

*Primary Examiner* — Natalia A Gondarenko
(74) *Attorney, Agent, or Firm* — RMCK Law Group, PLC

(57) ABSTRACT

The present invention relates to a method for assembling molecules on the surface of a two-dimensional material formed on a substrate, the method comprises: forming a spacer layer comprising at least one of an electrically insulating compound or a semiconductor compound on the surface of the two-dimensional material, depositing molecules on the spacer layer, annealing the substrate with spacer layer and the molecules at an elevated temperature for an annealing time duration, wherein the temperature and annealing time are such that at least a portion of the molecules are allowed to diffuse through the spacer layer towards the surface of the two-dimensional material to assemble on the surface of the two-dimensional material. The invention also relates to an electronic device.

13 Claims, 10 Drawing Sheets

(58) Field of Classification Search
CPC . H01L 21/2225; H01L 21/223; H01L 21/041; H01L 21/0455; H01L 21/2254; H01L 21/02378; H01L 21/02664; H01L 21/02527; H01L 43/065; H01L 31/0272; H01L 31/02725; H01L 31/0336; H01L 31/035209; H01L 31/035218; H01L 31/035272; H01L 31/035236; H01L 31/117; H01L 31/118; H01L 31/14; H01L 31/125; H01L 31/18; H01L 2924/055; H01L 2924/0566; H01L 2924/12041; H01L 2924/12042; H01L 2924/12043; H01L 2924/13088; H01L 2924/15792; H01L 29/06; H01L 29/66015; H01L 29/803; H01L 29/122; H01L 29/775; H01L 29/7782; C01B 32/188; C01B 32/194; C01B 32/182; C01B 2204/22; B82Y 10/00; B82Y 40/00; B82Y 30/00
USPC ... 257/29, 9, 12, 14, 15, 21, 22, 24, 27.159, 257/31.005; 438/92, 458, 478, 408
See application file for complete search history.

(56) References Cited

U.S. PATENT DOCUMENTS

| | | | |
|---|---|---|---|
| 2010/0258786 A1 | 10/2010 | Wang et al. | |
| 2011/0127471 A1 | 6/2011 | Shin et al. | |
| 2011/0143045 A1 | 6/2011 | Veerasamy | |
| 2012/0045865 A1 | 2/2012 | Afzali-Ardakani et al. | |
| 2012/0058350 A1 | 3/2012 | Long et al. | |
| 2013/0032913 A1* | 2/2013 | Kimura | H01L 31/022466 977/734 |
| 2013/0134392 A1 | 5/2013 | Afzali-Ardakani et al. | |
| 2014/0054550 A1 | 2/2014 | Hong et al. | |
| 2014/0238591 A1 | 8/2014 | Choi et al. | |
| 2015/0155681 A1 | 6/2015 | Özyilmaz et al. | |
| 2015/0214482 A1* | 7/2015 | Park | H01L 21/76251 257/40 |
| 2015/0221499 A1* | 8/2015 | Park | H01L 21/0228 257/29 |
| 2016/0343746 A1* | 11/2016 | Xue | H01L 27/1288 |
| 2017/0125263 A1* | 5/2017 | Park | H01L 21/428 |
| 2017/0338057 A1* | 11/2017 | Moon | C01B 32/05 |

OTHER PUBLICATIONS

Abdula, D. et al., "Performance and Photovoltaic Response of Polymer-Doped Carbon Nanotube p-n Diodes," ACS Nano, vol. 2, No. 10, 2008, pp. 2154-2159.
Barja, S. et al., "Self-organization of electron acceptor molecules on graphene," Chem. Commun., vol. 46, 2010, pp. 8198-8200.
Cai, B. et al., "Noncovalent Molecular Doping of Two-Dimensional Materials," ChemNanoMat, vol. 1, 2015, pp. 542-557.
Chen, W. et al., "Surface Transfer p-Type Doping of Epitaxial Graphene," J. Am. Chem. Soc., vol. 129, 2007, pp. 10418-10422.
Christodoulou, C. et al., "Tuning the Work Function of Graphene-on-Quartz with a High Weight Molecular Acceptor," J. Phys. Chem. C, vol. 118, 2014, pp. 4784-4790.
Christodoulou, C. et al., "Tuning the Electronic Structure of Graphene by Molecular Dopants: Impact of the Substrate," ACS Appl. Mater. Interfaces, vol. 7,2015, pp. 19134-19144.
Coletti, C. et al., "Charge neutrality and band-gap tuning of epitaxial graphene on SiC by molecular doping," Physical Review B, vol. 81, 2010, pp. 235401-1 through 235401-8.
Fujimoto, R. et al., "Control of molecular doping in conjugated polymers of thermal annealing," Organic Electronics, vol. 47,2017, pp. 139-146.
Garnica, M. et al., "Long-range magnetic order in a purely organic 2D layer adsorbed on epitaxial graphene," Nature Physics, vol. 9, Jun. 2013, pp. 368-374.

He, H. et al., "Uniform doping of graphene close to the Dirac point by polymer-assisted assembly of molecular dopants," Nature Communications, vol. 9:3956, 2018, pp. 1-7.
Jacobs, I.E. et al., "Comparison of solution-mixed and sequentially processed P3HT:F4TCNQ films: effect of doping-induced aggregation on film morphology," J Mater. Chem. C, vol. 4,2016, pp. 3454-3466.
Jacobs, I.E. et al., "Controlling Molecular Doping in Organic Semiconductors," Adv. Mater. 2017, 1703063, pp. 1-39.
Janssen, T.J.B.M. et al., "Quantum resistance metrology using graphene," Reports on Progress in Physics, vol. 76, 104501 (2013), IOP Publishing, 25 pages.
Järvinen, P. et al., "Molecular Self-Assembly on Graphene on SiO2 and h-BN Substrates," Nano Lett., vol. 13, 2013, pp. 3199-3204.
Jeong, J. et al., "Impacts of Molecular Orientation on the Hole Injection Barrier Reduction: CuPc/HAT-CN/Graphene," J. Phys Chem. C, vol. 120, 2016, pp. 2292-2298.
Kang, K. et al., "2D coherent charge transport in highly ordered conducting polymers doped by solid state diffusion," Nature Materials, vol. 15, Aug. 2016, pp. 896-903.
Kiefer, D. et al., "A Solution-Doped Polymer Semiconductor: Insulator Blend for Thermoelectrics," Adv. Sci., vol. 4, 1600203, 2017, pp. 1-9.
Knap, M. et al., "Transport in Two-Dimensional Disordered Semimetals," Phys. Rev. Lett., vol. 113, No. 18, 2014, pp. 186801-1 through 186801-5.
Kroon, R. et al., "Polar Side Chains Enhance Processability, Electrical Conductivity, and Thermal Stability of a Molecularly p-Doped Polythiophene," Adv. Mater. vol. 29, 2017, 1700930, pp. 1-7.
Kumar, A. et al., "Charge-Transfer-Driven Nonplanar Adsorption of F4TCNQ Molecules on Epitaxial Graphene," ACS Nano, vol. 11, 2017, pp. 4960-4968.
Kumar, A. et al., "Molecular assembly on two-dimensional materials," Nanotechnology, vol. 28, 2017, 24 pages.
Lara-Avila, S. et al., "Non-Volatile Photochemical Gating of an Epitaxial Graphene/Polymer Heterostructure," Advanced Materials, vol. 23, 2011, pp. 878-882.
Li, J. et al., "Measurement of Small Molecular Dopant F4TCNQ and C60F36 Diffusion in Organic Bilayer Architectures," ACS Applied Materials and Interfaces, vol. 7, 2015, pp. 28420-28428.
Li, J. et al., "Quantitative Measurements of the Temperature-Dependent Microscopic and Macroscopic Dynamics of a Molecular Dopant in a Conjugated Polymer," Macromolecules, vol. 50, No. 14, Jul. 2017, 15 pages.
Li, J. et al., "The effect of thermal annealing on dopant site choice in conjugated polymers," Organic Electronics, vol. 33, 2016, pp. 23-31.
Li, X. et al., "Graphene and related two-dimensional materials: Structure-property relationships for electronics and optoelectronics," Applied Physics Reviews, vol. 4, 2017, pp. 021306-1 through 021306-31.
Lu, G. et al., "Moderate doping leads to high performance of semiconductor/insulator polymer blend transistors," Nature Communications, 4:1588, 2013, pp. 1-8.
Macleod, J.M. et al., "Molecular Self-Assembly on Graphene," Small, vol. 10, No. 6, 2014, pp. 1038-1049.
Misseeuw, L. et al., "Optical-quality controllable wet-chemical doping of graphene through a uniform, transparent and low-roughness F4-TCNQ/MEK layer," RSC Adv., vol. 6, 2016, pp. 104491-104501.
Müller, C., "On the Glass Transition of Polymer Semiconductors and Its Impact on Polymer Solar Cell Stability," Chem. Mater., vol. 27, 2015, pp. 2740-2754.
Patel, S.N. et al., "Morphology controls the thermoelectric power factor of a doped semiconducting polymer," Sci. Adv., vol. 3, Jun. 16, 2017, pp. 1-13.
PCT International Search Report and Written Opinion dated Jan. 29, 2019 for International Application No. PCT/SE2018/051257, 12 pages.
Pinto, H. et al., p-type doping of graphene with F4-TCNQ, J. Phys. Condens. Matter, vol. 21, 2009, 402001, 4 pages.
Scholes, D.T. et al., "Overcoming Film Quality Issues for Conjugated Polymers Doped with F4TCNQ by Solution Sequential Pro-

(56) References Cited

OTHER PUBLICATIONS cessing: Hall Effect, Structural, and Optical Measurements," J. Phys. Chem. Lett., vol. 6, 2015, pp. 4786-4793.
Stradi, D. et al., "Controlling the spatial arrangement of organic magnetic anions adsorbed on epitaxial graphene on RU(0001)," Nanoscale, vol. 6, 2014, pp. 15271-15279.
Sun, J.T. et al., "Linear tuning of charge carriers in graphene by organic molecules and charge-transfer complexes," The American Physical Society, Physical Review B, vol. 81, 2010, pp. 155403-1 through 155403-6.
Tian, X. et al., "Band Gap Opening of Bilayer Graphene by F4-TCNQ Molecular Doping and Externally Applied Electric Field," J. Phys. Chem. B, vol. 114, No. 35, 2010, pp. 11377-11381.
Tsai, H.-Z. et al., "Molecular Self-Assembly in a Poorly Screened Environment: F4TCNQ on Graphene/BN," ACS Nano, vol. 9, No. 12, 2015, pp. 12168-12173.
Wang, X. et al., "Quantitative Analysis of Graphene Doping by Organic Molecular Charge Transfer," J. Phys. Chem. C, vol. 115, 2011, pp. 7596-7602.
Yamagishi, Y. et al., "Organic field-effect transistors with molecularly doped polymer gate buffer layer," Synthentic Metals, vol. 162, 2012, pp. 1887-1893.
Yang, M. et al., "Puddle-Induced Resistance Oscillations in the Breakdown of the Graphene Quantum Hall Effect," Phys. Rev. Lett, vol. 117, No. 23, 2016, 6 pages.
Yang, S. et al., "Many-body dispersion effects on the binding of TCNQ and F4-TCNQ with graphene," Carbon, vol. 111, 2017, pp. 513-518.
Yu, L. et al., "High-Performance WSe2 Complementary Metal Oxide Semiconductor Technology and Integrated Circuits," Nano Lett. vol. 15, 2015, pp. 4928-4934.
Burwell, G. et al., "Synthesis and characterization of (3-aminopropyl)triethoxysilane-modified epitaxial graphene," Materials Science Forum, vol. 806, Oct. 31, 2014, https://www.scientific.net/MSF.806.95.pdf, pp. 95-102.
Coletti, C. et al., "Band structure engineering of epitaxial graphene on SiC by molecular doping," arxiv.org, Cornell University Library, 201 Olin Library Cornell University Ithaca, NY 14853, Sep. 16, 2009, (Sep. 16, 2009), XP55621385, DOI: 10.1103/PHYSREVB.81.235401, 9 pages.
Extended European Search Report dated Sep. 14, 2021 for EP Application No. 18892036.7, 10 pages.
Riedl, C. et al., "Structural and electronic properties of epitaxial graphene on SiC(0001): a review of growth, characterization, transfer doping and hydrogen intercalation," J. Phys. D: Appl. Phys. vol. 43, No. 37, Sep. 2, 2010, pp. 1-17.

* cited by examiner

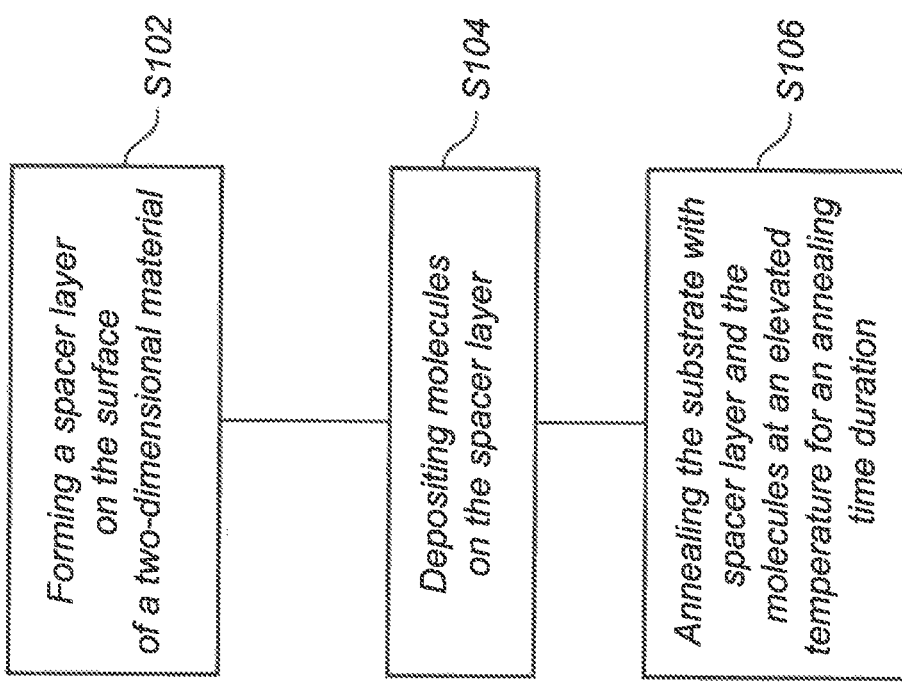
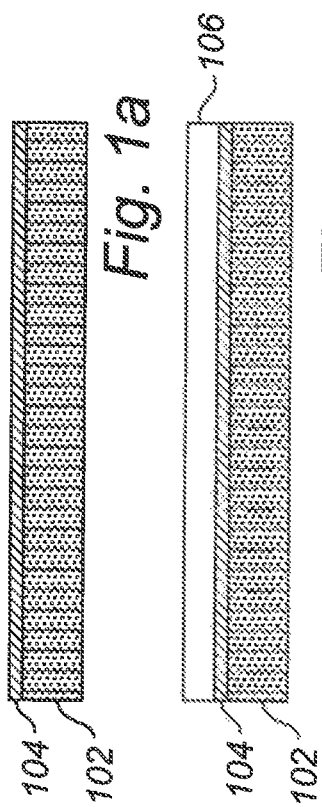
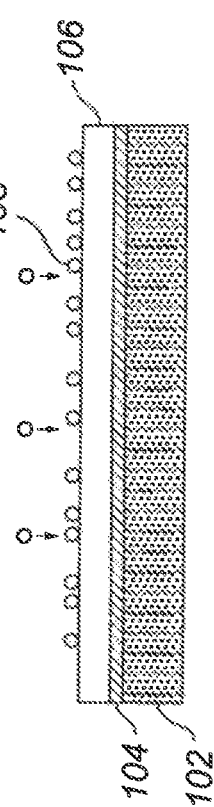

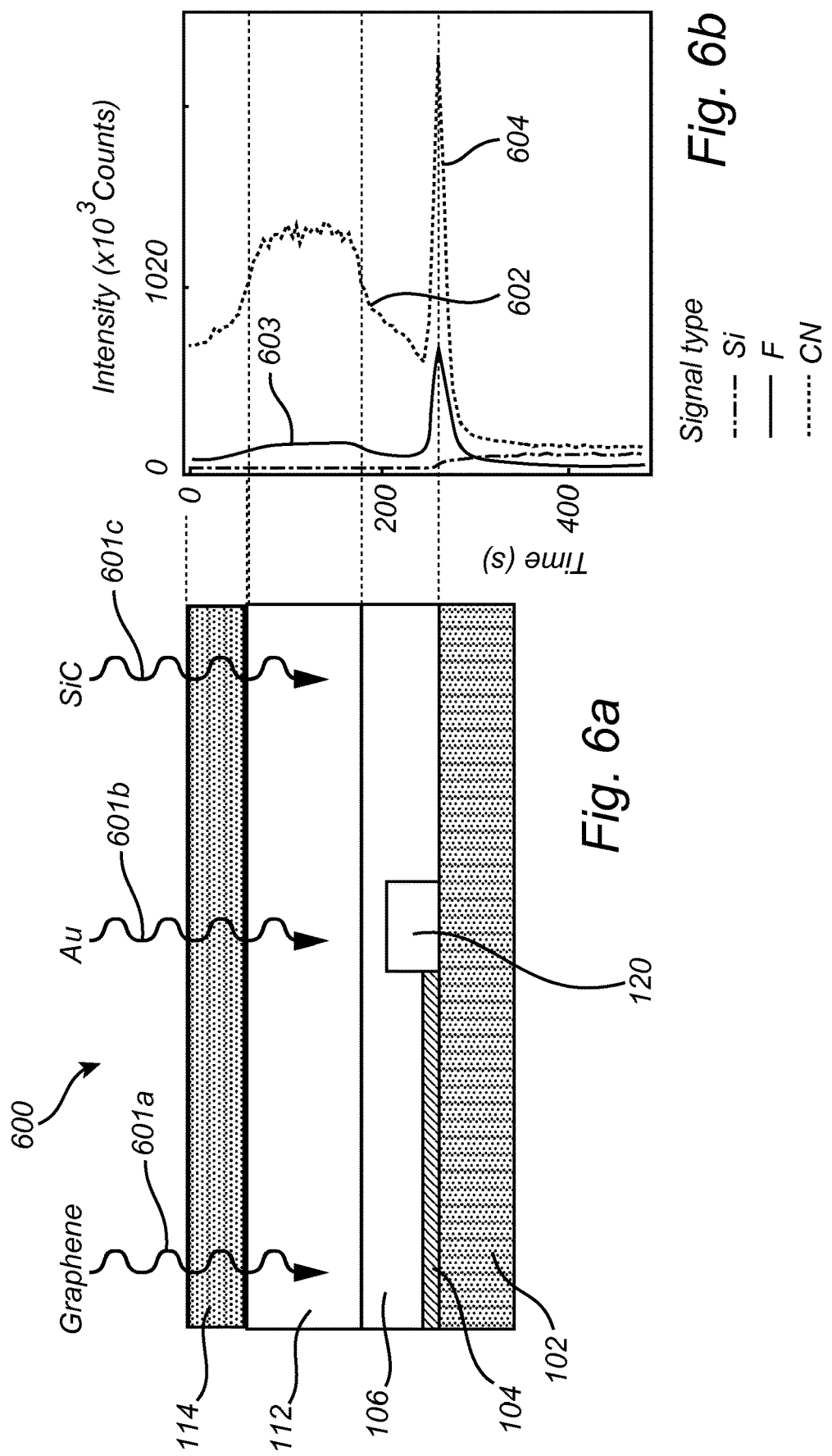

ASSEMBLING OF MOLECULES ON A 2D MATERIAL AND AN ELECTRONIC DEVICE

CROSS-REFERENCE TO RELATED APPLICATIONS

This application is a 371 U.S. National Stage of International Application No. PCT/SE2018/051257, filed Dec. 6, 2018, which claims priority to Swedish Patent Application No. 1751625-3, filed Dec. 22, 2017. The disclosures of each of the above applications are incorporated herein by reference in their entirety.

FIELD OF THE INVENTION

The present invention relates to a method for assembling molecules on the surface of a two-dimensional material formed on a substrate. The invention further relates to an electronic device.

BACKGROUND OF THE INVENTION

The possibility to assemble organic molecules on two-dimensional materials (2D materials), such as for example graphene has recently been proposed to provide enhanced electronic properties of 2D materials. The assembly of molecules on 2D materials may also provide means for creating novel 2D materials with properties which are not available in bare 2D crystals.

It appears that the organization and conformation of molecules on the 2D crystal may influence the electronic structure of the 2D material by interplay of interactions between the 2D material and deposited molecules. However, it is of importance that the molecules form a layer on the 2D material and not form closely packed islands.

Traditionally, molecules are deposited onto the 2D material in ultra high vacuum (UHV) conditions. However, the molecule-2D material complex prepared by sublimation of molecules onto the 2D material in UHV conditions—is chemically unstable and deteriorates upon exposure to ambient conditions, and this complicates the use of the molecule-2D material for some implementations, such as implementations employing doped 2D-materials, where the doping may be achieved by assembly of dopant molecules on the surface of the 2D material.

Accordingly, there is room for improvements in processes for preparing composites of 2D material having a molecular layer on the 2D material surface. There also appears to be a need for such composites with improved chemical stability.

SUMMARY

In view of the above-mentioned and other drawbacks of the prior art, it is an object of the present invention to provide a method which allows for the preparation of composites comprising a molecule layer on a 2D material that are chemically stable not only in ultra high vacuum and at cryogenic temperatures, but also at higher temperature and pressure conditions such as ambient conditions.

According to a first aspect of the present invention, it is therefore provided a method for assembling molecules on the surface of a two-dimensional material formed on a substrate, the method comprises: forming a spacer layer comprising at least one of an electrically insulating compound or a semiconductor compound on the surface of the two-dimensional material, depositing molecules on the spacer layer, annealing the substrate with spacer layer and the molecules at an elevated temperature for an annealing time duration, wherein the temperature and annealing time are such that at least a portion of the molecules are allowed to diffuse through the spacer layer towards the surface of the two-dimensional material to assemble on the surface of the two-dimensional material.

The present invention is based on the realization to allow the molecules to diffuse through a spacer layer for assembling on the surface of the two-dimensional material. Accordingly, the molecules are not directly deposited onto the surface of the 2D material; instead, a spacer layer is first formed on the 2D material. Next, the molecules are deposited on the spacer layer and diffuse through the spacer layer towards the surface of the 2D material during an annealing process in a predetermined temperature for a predetermined time duration.

With the inventive concept, there is no need for ultra-high-vacuum when depositing the molecules. Furthermore, the spacer layer provides for embedding the molecules which are assembled on the surface of the 2D material, which is at least partly responsible for providing the chemical stability of the molecule assembly on the surface of the 2D material.

A 2D material in accordance with the present inventive concept preferably only comprises a single atomic layer or only a few atomic layers of one or more atomic species.

The electrically insulating compound or semiconductor compound forming the spacer layer may be any such compound which allows the diffusion of molecules through the compound during an annealing process. The spacer layer is preferably a solid spacer layer.

The semiconductor compound may be a wide bandgap semiconductor in some possible implementations. A wide bandgap semiconductor may have a bandgap larger than 2 eV.

That the annealing temperature is at an elevated temperature should be interpreted broadly but is preferably above room temperature. The annealing time and temperature may be based on several factors, such as the characteristics of the compound of the spacer layer. Generally, the interplay between the compound of the spacer layer and the annealing time and temperatures should be such that the molecules are allowed to diffuse through the spacer layer during the annealing.

In some embodiments, the spacer layer is encapsulated with at least one encapsulating layer comprising an electrically insulating compound after the molecules have been deposited on the spacer layer. Accordingly, the molecules deposited on the spacer layer are provided with encapsulation which advantageously provides further improved chemical stability of the molecular assembly on the 2D material. The encapsulating layer(s) may comprise the same compound as the spacer layer.

According to further embodiments, at least one metal layer may be deposited on the encapsulating layer(s). The metal layer(s) impede escape of the molecules from the surface of the 2D material, and also from the spacer layer, in particular when the spacer layer is a polymer matrix and thereby provide further improved stability.

In some possible embodiments, the electrically insulating compound in the spacer layer may comprise a polymer, wherein the annealing temperature is above the glass transition temperature of the electrically insulating polymer. Annealing above the glass transition temperature advantageously allows for faster diffusion of the molecules through the spacer layer.

According to embodiments of the invention, the molecules may be molecular dopants, wherein the molecular dopants diffuse through the spacer layer towards the surface of the two-dimensional material to assemble on the surface of the two-dimensional material to thereby dope the two-dimensional material. Accordingly, there is provided a method for doping a two-dimensional material in a stable manner at ambient conditions. In this manner, high mobility and stable 2D materials may be provided.

The annealing time and annealing temperature may be based on a desired degree of doping of the two-dimensional layer.

The forming of the spacer layer may be performed in various ways. In one implementation, forming the spacer layer comprises: coating the layer of two-dimensional material with a liquid comprising an electrically insulating polymer, and annealing the coated substrate comprising the two-dimensional material for a second time duration at a temperature above the glass transition temperature of the electrically insulating polymer to form the spacer layer on the two-dimensional material. Thereby, a relatively simple method for forming the spacer layer is provided.

The liquid comprising electrically insulating polymer may for example be spin-coated onto the two-dimensional material on the substrate. However, the liquid comprising electrically insulating polymer may also be applied by dipping the substrate into the liquid or by spraying the liquid onto the 2D material. Spin-coating provides a simple and reliable method for coating the two-dimensional material with the liquid.

According to other possible implementations, the spacer layer may be formed by depositing the electrically insulating polymer by at least one of physical vapor deposition or chemical vapor deposition.

Depositing molecules on the spacer layer may comprise coating the spacer layer with a liquid solution comprising an electrically insulating polymer and the molecules. This allows for relatively simple preparation for molecule deposition on the spacer layer. Furthermore, it allows for spin-coating the spacer layer with the liquid solution comprising the electrically insulating polymer and the molecular dopant, in a similar manner as with the spacer layer. In addition, the chemical stability in air is further improved by embedding the molecule into a suitable polymer matrix, to form a polymer blend dopant layer.

The concentration of the molecule in the liquid solution is chosen based on their molecular mass and density. For example, the concentration by weight of the molecular dopant in the liquid solution may be at least 0.2%, such as 0.5%, 0.8%, 1%, or 2%.

The spacer layer may advantageously encapsulate the two-dimensional material on the substrate. Thereby, the molecules assembled on the surface of the 2D material are more reliably maintained on the surface.

The thickness of the spacer layer is at least 5 nm. For example, the spacer layer may be about 100 nm, 200 nm, or even 500 nm, 700 nm, or 1 micrometer.

At least one of the electrically insulating polymers comprises PMMA or copolymers of PMMA.

The two-dimensional material may be any two dimensional material exfoliated from its parent material.

In possible implementations, the two-dimensional material is epitaxial graphene. The graphene may be produced by chemical vapor deposition.

The substrate is preferably Silicon-carbide, in particular when the two-dimensional material is epitaxial graphene.

Various types of molecular dopants may be used and is within the scope of the claims, however, in one possible implementation the molecular dopant is at least one of Tetrafluoro-tetracyanoquinodimethane (F4TCNQ) and tetracyanoquinodimethane (TCNQ).

According to a second aspect of the present invention, there is provided an electronic device comprising: a substrate; a two-dimensional material formed on the substrate; a spacer layer comprising at least one of an electrically insulating compound or a semiconductor compound on the surface of the two-dimensional material a layer of electrically insulating compound and molecules formed on the space layer; an encapsulation layer comprising at least one of an electrically insulating compound or a semiconductor compound formed on the layer comprising the molecules; a metal layer formed on the encapsulation layer, wherein a layer of molecules of the same species as the molecules in the layer on the spacer layer is assembled on the layer of the two-dimensional material.

The molecules may be molecular dopants, whereby the molecular dopants on the spacer layer thereby causes doping of the two-dimensional material. The molecular dopants advantageously cause an increase of the mobility of the two-dimensional material. When the molecular dopants have diffused through the spacer layer, they are advantageously arranged on the surface of the two-dimensional material, which causes so-called modulation doping.

Furthermore, if the encapsulation layer is removed from an electronic device according to embodiments of the second aspect of the inventive concept, then it may be observed that the electronic mobility of the two-dimensional material is reduced. This might be caused by desorption of the molecular dopants away from the surface of the two-dimensional layer or by chemical degradation due to the removal of the encapsulation.

According to further embodiments of the inventive concept, the electronic device may comprise at least four connection pads connected to the two-dimensional material, wherein two of the connection pads are arranged as input ports for providing an electric current to the two-dimensional material, and wherein the other two connection pads are arranged as output ports for sensing a voltage across the two-dimensional material in response to an input signal acting on the two-dimensional material. Accordingly, the electronic device may be functional as a Hall bar, the input signal may be a magnetic field applied perpendicular to the surface of the two-dimensional material.

In addition, the electronic device may be a quantum resistance standard.

The metal layer may advantageously be configured as a gate for providing electrostatic gating of the doped two-dimensional material. In this way, the mobility and carrier density of the two-dimensional material may be tuned.

Further embodiments of, and effects obtained through this second aspect of the present invention are largely analogous to those described above for the first aspect of the invention.

According to a third aspect of the invention, there is provided use of an electronic device according to any one of the embodiments of the second aspect, as a quantum resistance standard.

Further features of, and advantages with, the present invention will become apparent when studying the appended claims and the following description. The skilled addressee realizes that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 1a-d schematically illustrate method steps for assembling molecules on the surface of a two-dimensional material;

FIG. 1e is a flow-chart of method steps according to embodiments of the invention;

FIG. 6a-c shows chemical profiling of a polymer heterostructure and underlying (doped) graphene using ToF-SIMS;

DETAILED DESCRIPTION OF EXAMPLE EMBODIMENTS

Figure 2A:
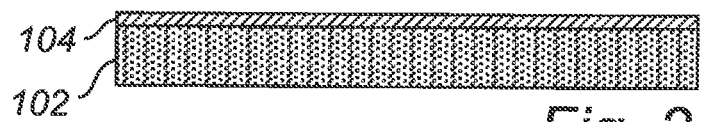
FIG. 2a-f schematically illustrate method steps for assembling molecules on the surface of a two-dimensional material.

In the present detailed description, various embodiments of the inventive concept is mainly described with reference to a two-dimensional material in the form of graphene and molecular dopants in the form of F4TCNQ. However, it should be noted that this by no means limits the scope of the present invention, which equally well applicable to any two dimensional material exfoliated from its parent material, and to any molecule which can diffuse through a suitable spacer layer.

FIG. 1a-d schematically illustrates a method for assembling molecules on the surface of a two-dimensional material. FIG. 1a-d will be described in conjunction with the flow-chart of method steps illustrated in FIG. 1e.

FIG. 1a illustrates a substrate 102 having thereon a layer of a two-dimensional material 104. The two-dimensional material may be any two dimensional material exfoliated from its parent material. In one preferred implementation, the two-dimensional material 104 is epitaxial graphene produced by chemical vapor deposition on a silicon-carbide substrate 102. The epitaxial graphene may be wafer scale graphene grown on the silicon-carbide substrate 102.

FIG. 1b illustrates a spacer layer 106 that has been formed (step S102, FIG. 1e) on the two-dimensional material 104. The spacer layer comprises an electrically insulating compound, or a semiconductor compound. The spacer layer 106 may be produced in various ways, for example, by coating the two-dimensional material 104 with a liquid comprising an electrically insulating polymer, and subsequently annealing the substrate with the liquid solution above the glass transition temperature of the electrically insulating polymer. Alternatively, the spacer layer 106 may be produced by physical vapor deposition (PVD) or chemical vapor deposition (CVD). The fabrication process (e.g. coating with a liquid, PVD, CVD) depends at least partly on the type of electrically insulating compound, or type of semiconductor compound. PVD and CVD are standard micro-fabrication processes known to the skilled person. The thickness of the spacer layer 106 depends on the type of spacer layer material but is preferably at least 5 nm thick, but it may be up to even 500 nm thick.

Now turning to FIG. 1c illustrating molecules 108 being deposited (step S104, FIG. 1e) on the surface of the spacer layer 106. Only one of the molecules 108 is numbered to avoid cluttering the drawings. There are various ways of depositing the molecules on the spacer layer, one which will be described with reference to subsequent drawings. Example methods include evaporation processes, deposition from solution, and spray coating.

The substrate with the spacer layer and the molecules deposited on the spacer layer are annealed (step S106, FIG. 1e) at an elevated temperature for a predetermined time duration. The elevated temperature is above room temperature and is generally determined based on the material of the spacer layer 106 and the properties of the molecule 108. The annealing temperature and the annealing time are selected such that the molecules 108 are allowed to diffuse through the spacer layer 106 towards the two-dimensional material 104. As conceptually illustrated in FIG. 1d, the molecules 108 assemble on the surface of the two-dimensional material 104 after havening diffused through the spacer layer 106 during annealing.

Now turning to FIGS. 2a-d which schematically illustrate a method for assembling molecules on the surface of a two-dimensional material. FIG. 2a-d will be described in conjunction with the flow-chart of method steps illustrated in FIG. 3.

Similar to FIG. 1a, FIG. 2a illustrates a substrate 102 having thereon a layer of a two-dimensional material 104. The two-dimensional material 104 may be any two dimensional material exfoliated from its parent material. In one possible implementation, the two-dimensional material 104 is epitaxial graphene produced by chemical vapor deposition on a silicon-carbide substrate 102. The epitaxial graphene may be wafer scale graphene grown on the on the silicon-carbide substrate 102.

Figure 2B:
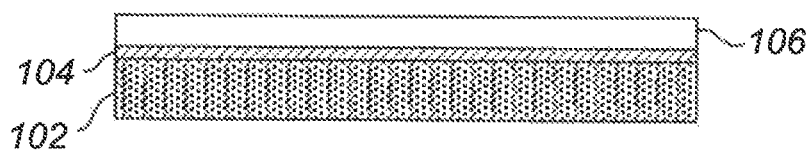
Figure 3:
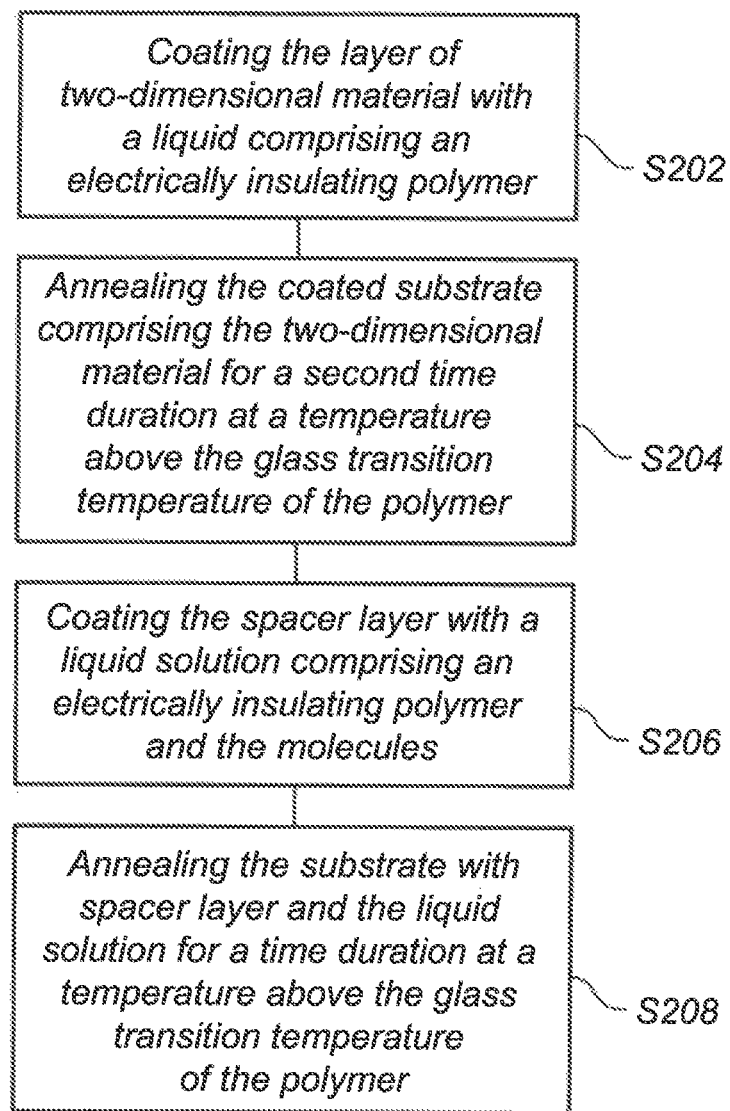
FIG. 3 is a flow-chart of method steps according to embodiments of the invention.

A spacer layer 106 as illustrated in FIG. 2b may be formed by first coating the layer of two-dimensional material 104 with a liquid comprising an electrically insulating polymer as is also indicated by step S202 in FIG. 3. The substrate 102 with the two dimensional material 104 coated with the liquid solution is annealed (step S204, FIG. 3) for a time duration at an elevated temperature above the glass transition temperature of the electrically insulating polymer. In this way, the spacer layer 106 is formed in this presently described example embodiment. Coating the layer of two-dimensional material 104 with the liquid comprising the electrically insulating polymer may be performed by spin-coating methods known per se to the skilled person.

In one possible implementation the electrically insulating polymer is poly(methyl methacrylate) (PMMA). In case of using PMMA in the spacer layer 106, the PMMA is typically dissolved in a suitable solvent and the annealing temperature should be sufficiently high so that the glass transition temperature (which depends on the molecular weight of PMMA) is exceeded. For example, the annealing time duration may be about 5 min and the annealing temperature about 160° C., such that a solid spacer layer is formed.

Figure 2C:
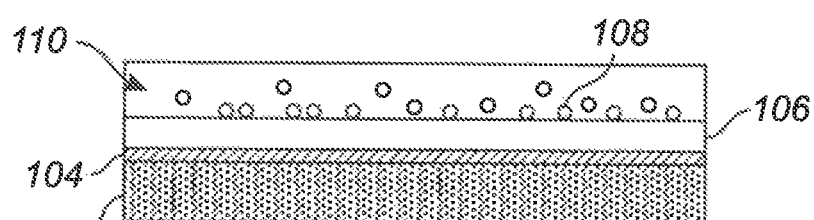
Figure 2D:
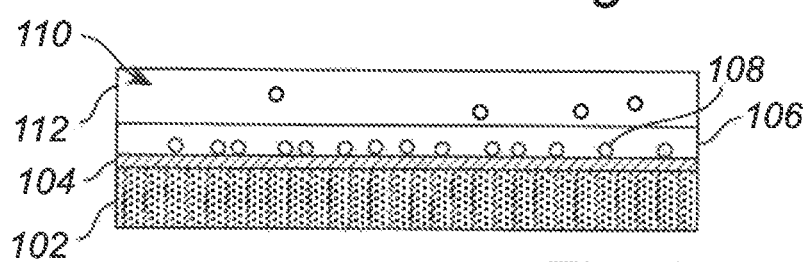

FIG. 2c illustrates that the spacer layer 106 has been coated with a liquid solution (step S206) comprising an electrically insulating polymer 110 and molecules 108. The coating may be performed by spin coating methods.

The substrate 102 with spacer layer 106 and the liquid solution comprising the molecules 102 and the electrically insulating polymer 110 is annealed (step S208, FIG. 3) for a time duration at an elevated temperature above the glass transition temperature of the electrically insulating polymer 110. Also this electrically insulating polymer may be PMMA or MMA, or copolymers of PMMA.

The annealing temperature and the annealing time are selected such that the molecules 108 are allowed to diffuse through the spacer layer 106 towards the surface two-dimensional material 104. As conceptually illustrated in FIG. 2d, the molecules 108 assemble on the surface of the two-dimensional material 104 after having diffused through the spacer layer 106 during annealing. However, there are often some molecules left in the annealed molecule layer 112 comprising the electrically insulating polymer 110 and molecules 108.

Figure 2E:
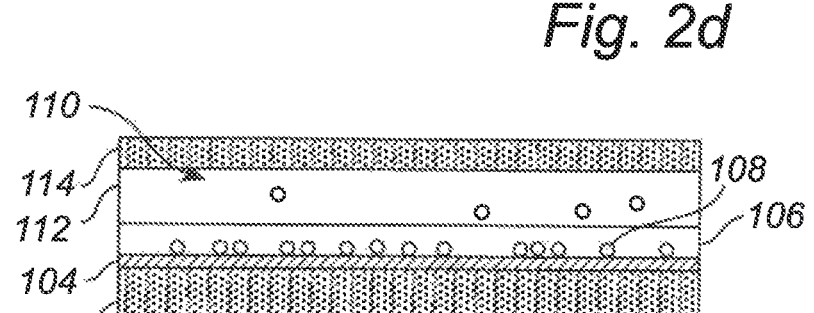
Figure 2F:
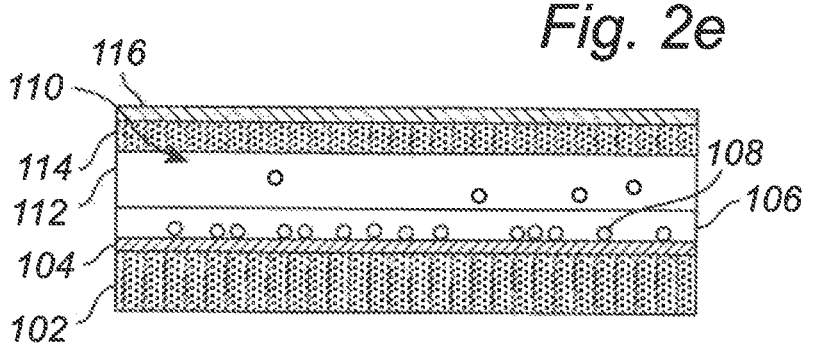
Figure 4:
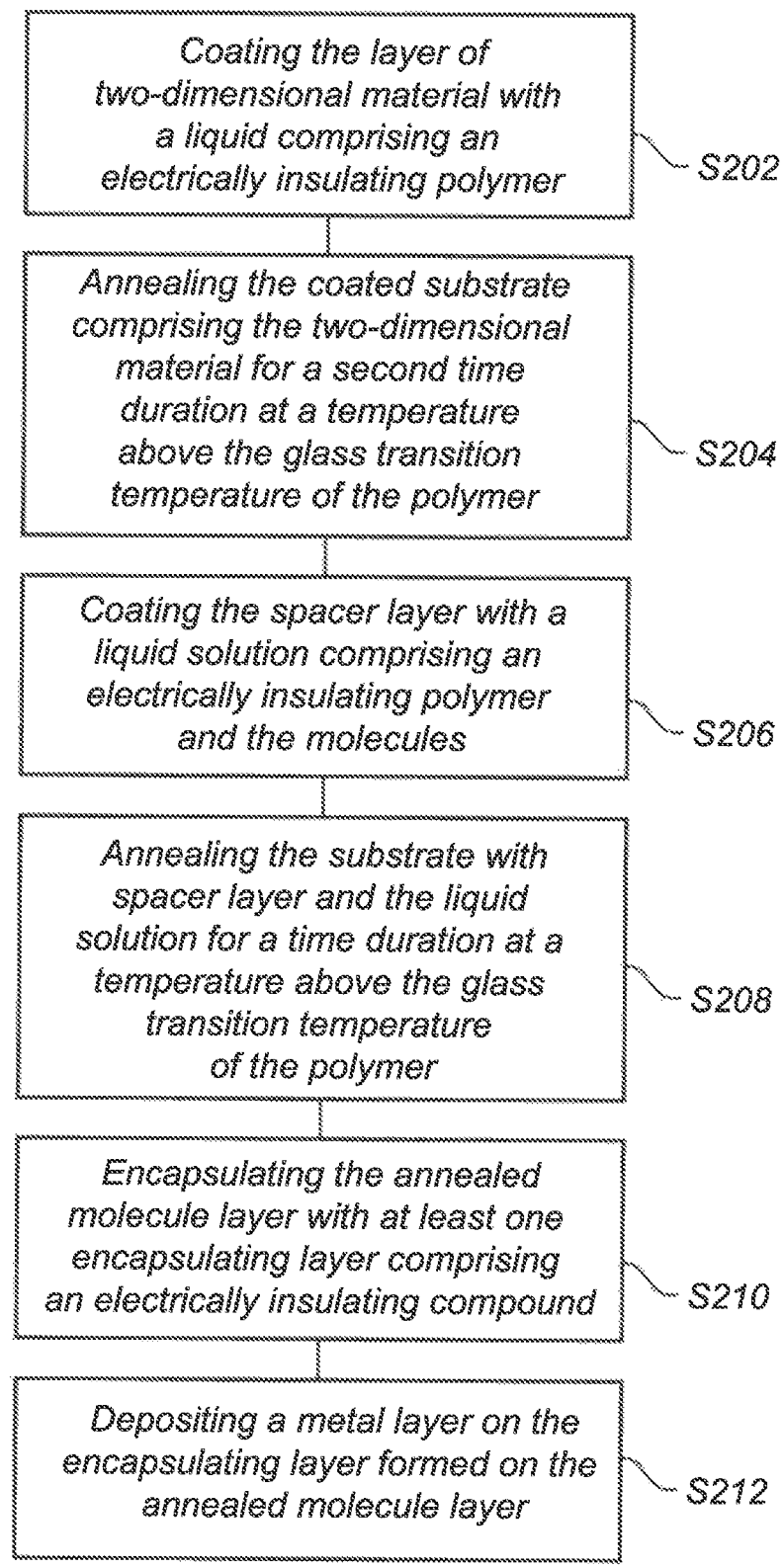
FIG. 4 is a flow-chart of method steps according to embodiments of the invention.

Now with reference to FIGS. 2e-f and to the flow-chart in FIG. 4. In further embodiments, an encapsulating layer 114 is formed on the annealed molecule layer 112 (step S210, FIG. 4) as schematically shown in FIG. 2e. The encapsulating layer 114 may comprise of an electrically insulating compound such as a polymer (e.g. PMMA or MMA, or copolymers of PMMA). The production of the encapsulating layer 114 may be performed in the same way as the above described layers comprising electrically insulating compounds (i.e. coating and annealing). The encapsulation layer improves the chemical stability of the assembled molecules 108 on the two-dimensional material 106. In particular, the encapsulation layer at least partly prevents drift in carrier concentration caused by exposure to ambient dopants.

Further, and as schematically illustrate in FIG. 2f, a metal layer 116 may be deposited on the encapsulating layer 114 (step S212, FIG. 4). The metal layer 116 may comprise e.g. gold or aluminum, and may be deposited using known processes such as sputtering, physical vapor deposition, chemical vapor deposition, etc. The metal layer 116 shields the molecules 108 assembled on the two-dimensional material 104 such that the chemical stability is further improved. In addition, the metal layer 116 may serve as a gate in embodiments where the molecules are molecular dopants. The metal gate may then be used for providing electrostatic gating of the doped two-dimensional material.

In some embodiments, the two-dimensional material is epitaxial graphene 104 grown on a silicon-carbide substrate 102. Further, the electrically insulating compound of the spacer layer 106 may be PMMA, as well as the electrically insulating compound in the annealed molecule layer 112 and the encapsulating layer 114. The molecules 108 may be Tetrafluoro-tetracyanoquinodimethane (F4TCNQ), although other molecules are also applicable, such as e.g. tetracyanoquinodimethane (TCNQ).

Spin-coating and annealing methods are known per se to the skilled person, as well as chemical vapor deposition and physical vapor deposition.

Figure 5A:
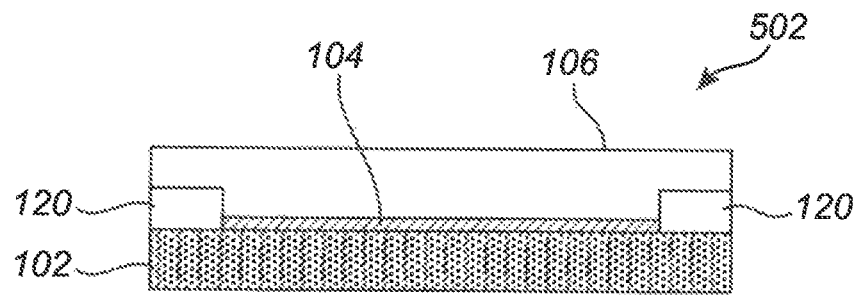
FIG. 5a is a cross-section of a first test device.
Figure 5B:
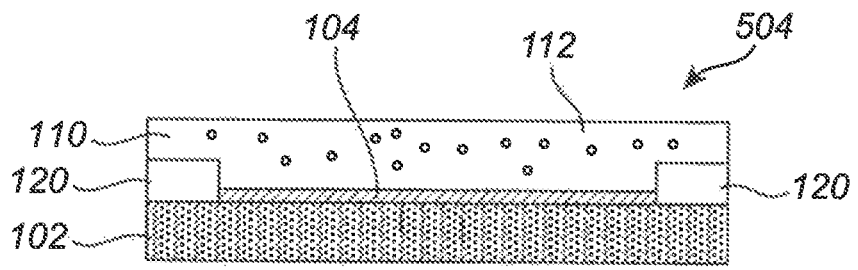
FIG. 5b is a cross-section of a second test device.
Figure 5C:
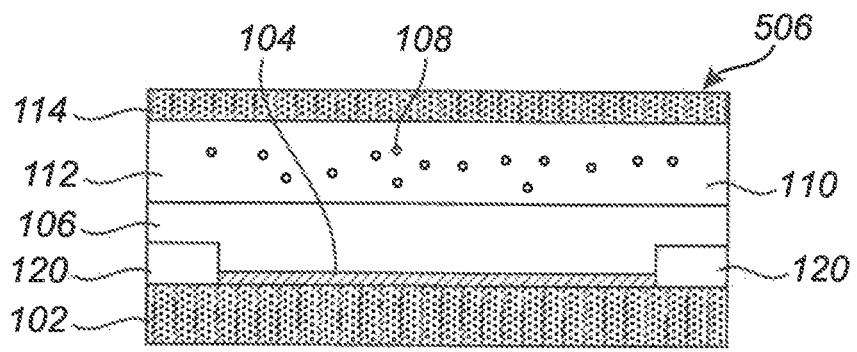
FIG. 5c is a cross-section of a third test device according to embodiments of the invention.

FIG. 5a-c each illustrates a cross-section of a respective test device used for comparing carrier density and electron mobility of an electronic device manufactured according to the inventive concept (FIG. 6c) with other test devices.

FIG. 5a shows a cross section of first test device 502 comprising a silicon-carbide substrate 102 having thereon a layer of graphene 104 and a layer of PMMA 106, which may correspond to a spacer layer 106.

FIG. 5b illustrates a cross section of second test device 504 comprising a silicon-carbide substrate 102 having thereon an annealed layer 112 of PMMA 110 and molecular dopants 108 (only one is numbered), in this case the molecular dopant is F4TCNQ.

FIG. 5c shows a cross section of a third test device 506 comprising a graphene layer 104 on a silicon-carbide substrate 102, a PMMA spacer layer 106, an annealed molecule layer 112 comprising PMMA 110, and an encapsulating layer 114 comprising PMMA.

All devices shown in FIGS. 5a-c comprises gold contacts 120 electrically connected to the graphene layer 104 for enabling Hall measurements to extract carrier density and mobility of the graphene layer 104. Accordingly, the devices are patterned as a Hall bar although only one portion of the devices are shown in the cross-sections in FIGS. 5a-c.

Figure 5D:
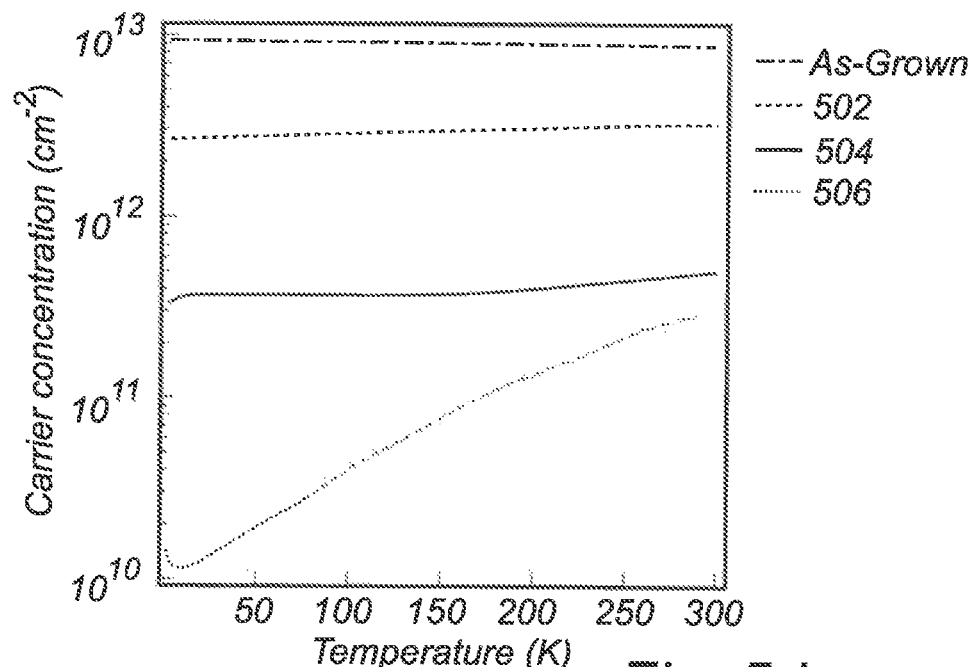
FIG. 5d shows carrier concentration as a function of temperature of the test devices in FIGS. 5a-c.

FIG. 5d shows carrier concentration as a function of temperature extracted from Hall measurements for pristine epitaxial graphene ("As-grown") and the test devices (502, 504, 506) shown in FIGS. 5a-c. Both PMMA (test device 502) and the F4TCNQ (test device 504) act independently as a p-dopant which can be seen from the lower carrier concentration in the curves for the test devices 502 and 504 compared to as-grown graphene, with the former being a weaker p-dopant. When deposited directly onto graphene, it is only when the PMMA spacer layer 106 is included between graphene and the F4TCNQ layer 112 (test device 506) that the carrier density of the epitaxial graphene decreases by three orders of magnitude, from $10^{13}$ to $10^{10}$ $cm^{-2}$ at T=4K (almost 2 orders of magnitude at room temperature).

Figure 5E:
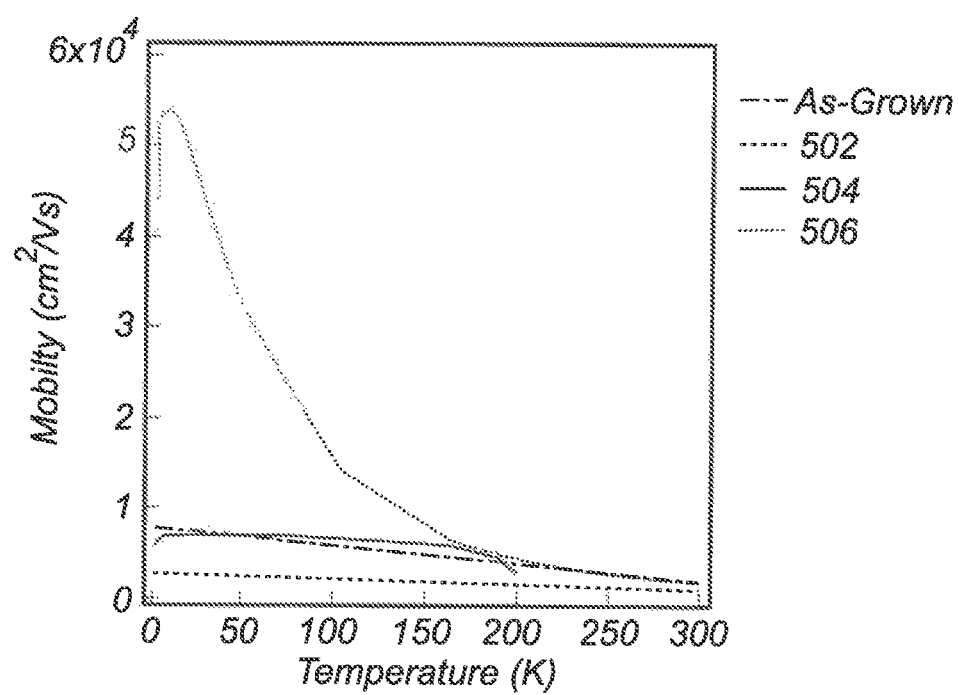
FIG. 5e shows mobility as a function of temperature of the test devices in FIGS. 5a-c.

FIG. 5e shows Hall carrier mobility as a function of temperature for measurements for pristine epitaxial graphene and the test devices (502, 504, 506) shown in FIGS. 5a-c. The carrier mobility for the test devices in FIG. 5a (502) and FIG. 5b (504) do not exceed 10,000 $cm^2/Vs$. However, for the third test device 506 schematically shown in FIG. 5c which has molecular dopant layer 112 on the spacer layer 106 the carrier mobility exceeds 50,000 $cm^2/Vs$.

Accordingly, as may be understood from the above, the molecule deposited on the spacer layer may be a molecular dopant such as F4TCNQ or TCNQ. Thereby, an air-stable functionalization of graphene with a molecular dopant is achieved which enables high mobility epitaxial graphene.

The thickness of the spacer layer 106 appears to not affect the improvement in carrier density and carrier mobility, at least not in the range of 100 nm to 500 nm which suggests that the diffusion of F4TCNQ molecules through the polymer is relatively quick. The spacer layer is preferably at least 5 nm thick.

The chemical composition of a manufactured electronic device has been investigated using Time-of-Flight Secondary Ion Mass Spectrometry (ToF-SIMS) depth profiling. FIG. 6a schematically illustrates a cross-section of the device 600 which was investigated and which was produced using a method according to the inventive concept. The cross-section in FIG. 6a illustrates a graphene layer 104 on a silicon-carbide substrate 102, a PMMA spacer layer 106 (about 100 nm thick) directly in contact with the substrate 102 and the graphene layer 104, an annealed molecule layer 112 comprising a PMMA-F4TCNQ blend (about 200 nm thick, molecules not shown), an encapsulating PMMA layer (about 100 nm thick) 114, and a gold pad 120 on the substrate 102 embedded by the spacer layer 106.

Figure 6C:
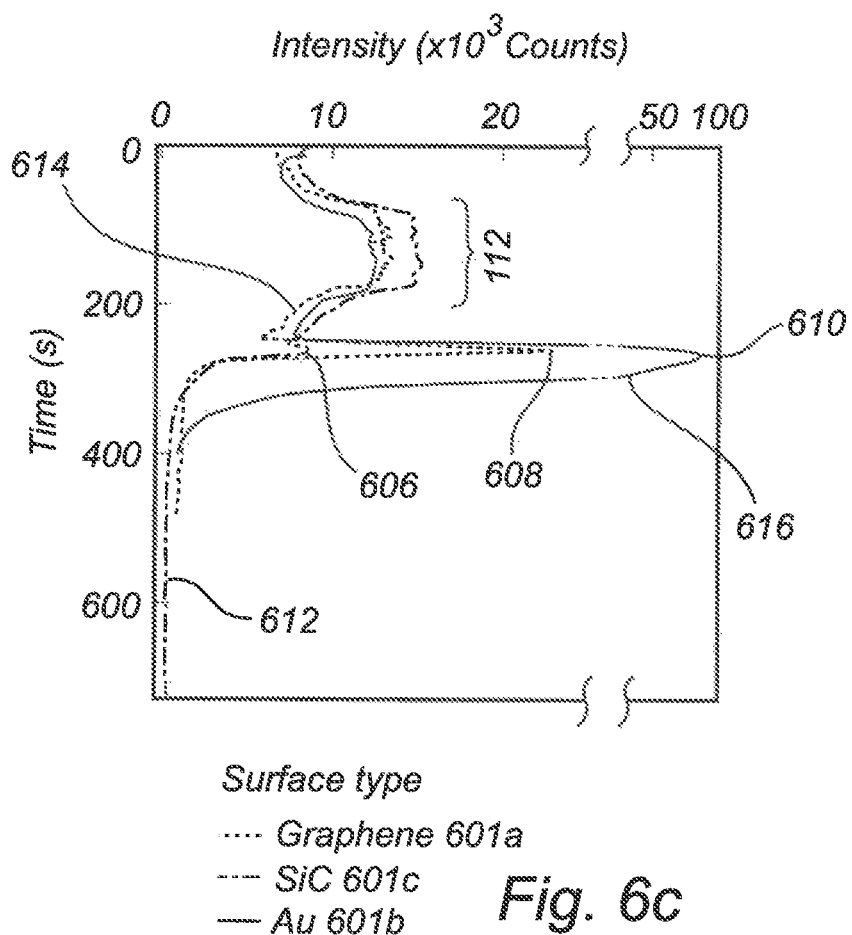

The results from the ToF-SIMS investigation is presented in FIG. 6b-c and show that F4TCNQ species diffuse through the PMMA spacer layer 106 to reach the graphene 104 surface, presumably form a charge-transfer complex with the graphene 104, and accumulate at the graphene/spacer interface as can be understood from FIG. 6b. FIG. 6b shows the chemical profile in the vertical axis with respect to the substrate, with ion intensity plotted as a function of sputter time, of the trilayer polymer stack along the direction normal to the surface of the graphene 104 indicated by the arrow 601a in FIG. 6a. The ion intensity is shown for flour (F) and the cyanogroup (CN) which both represent the dopant F4TCNQ. The ion intensity for silicon (Si) is also included in FIG. 6b.

In FIG. 6b, it can be seen that the intensity of the F4TCNQ counts indicated by the line 602 (CN) and 603 (F) has a small increase in the annealed molecule layer 112 indicating that there are still some F4TCNQ molecules left in the annealed molecule layer 112. At the interface between the graphene layer 104 and the PMMA spacer layer 106, there is a larger increase indicated by the peak 604 (curve for CN, see also the peak in F-intensity in curve 603), indicative of the accumulation of F4TCNQ molecules at the surface of the graphene layer 104.

FIG. 6c shows a comparison of the chemical profile in the vertical axis, with ion intensity plotted as a function of sputter time, of the trilayer polymer stack along the direction normal to the surface of the substrate at three different sites on the substrate: graphene (at arrow 601a in FIG. 6a), bare SiC (at arrow 601b in FIG. 6a), and thin Au film on graphene (at arrow 601c in FIG. 6a). The legend in FIG. 6c represents the site (e.g. at arrows 601a-c) at which the chemical profile was obtained on the device 600.

FIG. 6c illustrates the chemical signatures arising from the molecular dopant F4TCNQ (i.e. a CN signal as described with reference to FIG. 6b) at the site (601a) of the graphene, on SiC (601b), and on Au (601b). The signatures acquired at SiC or Au serves as an indicator of the polymer spacer layer substrate interface (seen at about 250 sputter seconds, also seen in FIG. 6b). Note that the thickness of each layer as estimated from SIMS is approximate since the rate of etching is different depending on material. Inhomogeneous sputtering, e.g. due to surface roughness, will also smear and broaden the interfaces, such as the F4TCNQ accumulation layer near graphene.

ToF-SIMS reveals not only that F4TCNQ is found at the annealed molecule layer 112 and the PMMA spacer layer 106, suggesting a rapid diffusion of F4TCNQ from the intermediate dopant layer 112 comprising F4TCNQ and PMMA, but also that dopants (F4TCNQ) reach the substrate 102 surface and accumulate at the conductive surfaces of graphene 104 and gold 120 (FIG. 6b and FIG. 6c).

Accordingly, F4TCNQ is mobile in polymer thin films and its diffusion depends on a number of parameters of the host polymer matrix (e.g. PMMA, MMA, or copolymers of PMMA), notably on the polarity and the glass transition temperature ($T_g$). Given the polarity of PMMA and the thermal annealing step of the described process above the glass transition temperature of the polymer ($T_g \sim 105°$ C.), a conservative estimate for the lower bound of the flux of F4TCNQ at the substrate surface is $j=D \cdot \Delta c/\Delta x = 5 \times 10^{-9}$ mol·cm$^{-2}$s$^{-1}$, which means that initially an amount of F4TCNQ equivalent to a 10 nm thick solid layer reaches the spacer/substrate interface per second. Here we have used $D \sim 10^{-10}$ cm$^2$ measured for diffusion of neutral F4TCNQ in nonpolar P3HT at about 50° C. (see e.g. Quantitative Measurements of the Temperature-Dependent Microscopic and Macroscopic Dynamics of a Molecular Dopant in a Conjugated Polymer," Macromolecules, vol. 50, no. 14, pp. 5476-5489, July 2017.), $\Delta c=5 \cdot 10^{-4}$ mol cm$^{-3}$ the initial F4TCNQ concentration gradient between the molecule layer 112 and spacer layer 106 (density of F4TCNQ $\rho \sim 1.4$ g cm$^{-3}$; molar mass M$\sim$276 g mol$^{-1}$), and $\Delta x=100$ nm is the thickness of the spacer layer 106.

The observed p-doping effect on graphene (see FIGS. 5a-e and above discussion) and the accumulation of F4TCNQ at the graphene 104 and gold surfaces 120, signaled by spike in CN-species followed by the appearance of either Si-signal or Au-signal (FIG. 6b and FIG. 6c), may be explained by the formation of a charge transfer complex that yields a F4TCNQ anion, which must remain at the graphene interface to preserve overall charge neutrality. In addition, slower diffusion of the F4TCNQ anion in polymer matrix has been observed in poly(3-hexylthiophene) (P3HT): F4TCNQ blends, in which the diffusion coefficient of neutral F4TCNQ is $10^{-11}$ cm$^2$s$^{-1}$ decreases by two orders of magnitude for the F4TCNQ-anion (see e.g. Quantitative Measurements of the Temperature-Dependent Microscopic and Macroscopic Dynamics of a Molecular Dopant in a Conjugated Polymer," Macromolecules, vol. 50, no. 14, pp. 5476-5489, July 2017.). When using PMMA as a host matrix for the F4TCNQ, the F4TCNQ remains neutral both in the doping layer and as it diffuses through PMMA spacer layers. It is only when it comes to contact with an electron donor, such as graphene, that charge transfer may take place.

With further reference to FIG. 6c, there appears to be virtually no accumulation of F4TCNQ at the polymer spacer/SiC interface as indicated by the relatively low peak 606 in CN-signal (at SiC, 601c) in the vertical axis towards the SiC substrate 102, the intensity of the CN-signal is roughly 50% greater at the graphene/PMMA spacer interface indicated by peak 608 (6-fold higher at gold/PMMA, see peak 610) compared to the signal measured at the dopant layer ($1.4 \times 10^{14}$ ions cm$^{-2}$). From the SIMS measurements an estimate of the fraction of molecules which reach graphene 104 can be calculated through the area under the ion intensity curves 612 (SiC, at arrow 601c), 614 (graphene, at arrow 601a in FIG. 6a), 616 (gold, at arrow 601b) in FIG. 6c. The total amount of available molecular dopants (F4TCNQ molecules) is calculated using the known densities of PMMA, anisole solvent in which the PMMA is initially dissolved, F4TCNQ molecule and the thickness of the F4TCNQ dopant layer after spin coating (presumed to be a slab of PMMA and F4TCNQ molecules only). Finally, this leads to the estimated number of F4TCNQ on the graphene surface to be roughly $\sim 7 \times 10^{14}$ molecules/cm$^2$.

Figure 7:
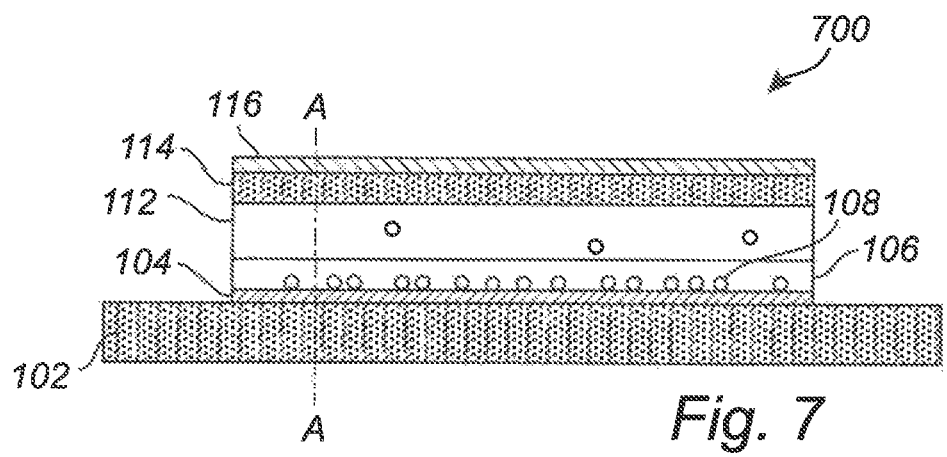
FIG. 7 schematically illustrates a cross-section of an electronic device according to embodiments of the invention.

FIG. 7 schematically illustrates a cross-section of an electronic device 700 according to embodiments of the invention. The electronic device comprises a substrate 102 and a two-dimensional material 104 formed on the substrate. The substrate 102 may be a silicon-carbide substrate and the two-dimensional material may be epitaxial graphene 104 grown on the substrate 102. There is further a spacer layer 106 comprising at least one of an electrically insulating compound or a semiconductor compound on the surface of the two-dimensional material 104. The spacer layer 106 may for example comprise an electrically insulating compound in form of PMMA or MMA, or a combination thereof. On the spacer layer 106 there is a layer 112 of electrically insulating compound and molecules 108. Also the electrically insulating compound in layer 112 may comprise PMMA or MMA, or a combination thereof.

An encapsulation layer 114 comprising at least one of an electrically insulating compound (e.g. PMMA or MMA, or a combination thereof) or a semiconductor compound has been formed on the layer 112 comprising the molecules 108. There is further a metal layer 116 formed on the encapsulation layer 114. A layer of molecules 108 of the same species as the molecules in the layer 112 on the spacer layer 106 is assembled on the layer of the two-dimensional material 104.

In some embodiments, the molecules are molecular dopants in the form of e.g. Tetrafluoro-tetracyanoquinodimethane (F4TCNQ) and/or tetracyanoquinodimethane (TCNQ). Molecular dopants allow doping of the two-dimensional material 104. The metal layer 116 may serve to further improve the chemical stability of the device in ambient conditions by preventing the desorption of molecular dopants from the polymer matrix into the surrounding environment.

Further, the metal layer 116 may serve as a gate for tuning the carrier concentration in the two-dimensional material 104.

Figure 8:
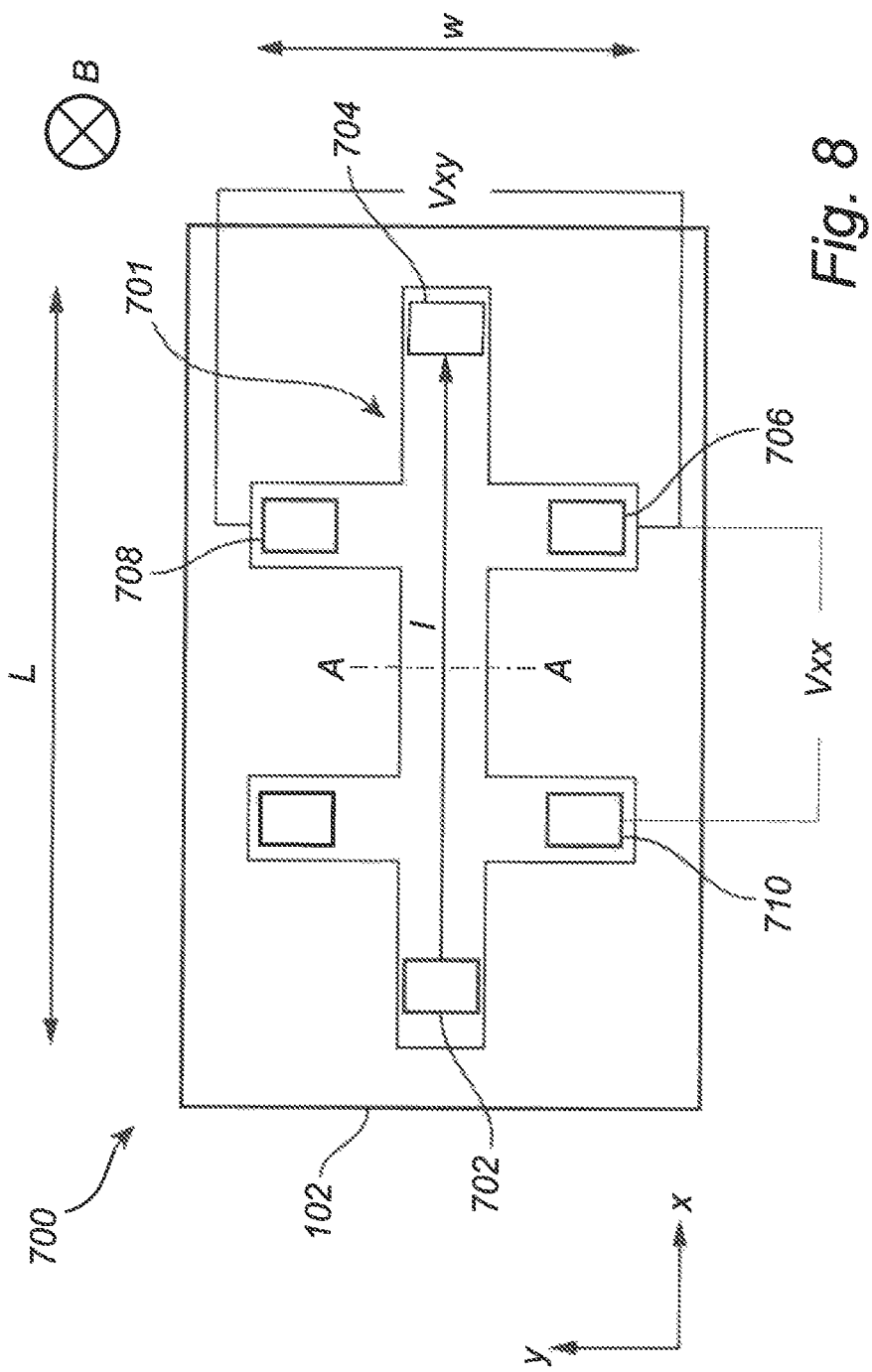
FIG. 8 schematically illustrates an electronic device according to embodiments of the invention.

FIG. 8 is a schematic top view of an example conceptual electronic device 700. The cross-section shown in FIG. 7 is indicated in FIG. 8 by lines A-A. The electronic device is here illustrated as a Hall bar 701 which may be used as an embodiment or realization of a quantum resistance standard by using the quantum Hall effect in the device.

The electronic device 700 may be fabricated using conventional lithography using e.g. electron beam lithography and/or photolithography, which are per se known to the skilled person.

The electronic device 700 comprises at least four connection pads connected to the two-dimensional material 104 (see FIG. 7). Two connection pads 702, 704 are arranged for enabling a current (I) to be passed through the two dimensional material in the x-direction, a longitudinal direction of the Hall bar 700. The two connection pads 706, 708 are arranged as output ports for measuring transverse voltage (Vxy) when the current (I) is passed through the two-dimensional material in the device 700 in the longitudinal direction (x). The two connection pads 706, 708 are spatially separated in the transverse direction (y). Furthermore, a longitudinal voltage (Vxx) may be measured between connection pad 706 and an additional connection pad 710 spatially separated from the connection pad 706 in the longitudinal direction. The size of a hall bar 700 may for example be: w=5 mm×L=3 mm, w=30 µm×L=100 µm, W=2 µm×L=10 µm.

The doping homogeneity of a two-dimensional material may serve to establish that the molecular dopants are homogenously spread on the surface of the two-dimensional material. The doping homogeneity of the Hall bar 701 was assessed using magneto-transport measurements at low temperatures (e.g. 2 Kelvin) and showed that the chemical doping of graphene 104 in the device 700 is significantly conformal over the entire hall bar 701 only when the spacer layer 106 is included between graphene 104 and the dopant layer 112. The doping homogeneity assessment will now be described with reference to FIG. 9.

Figure 9:
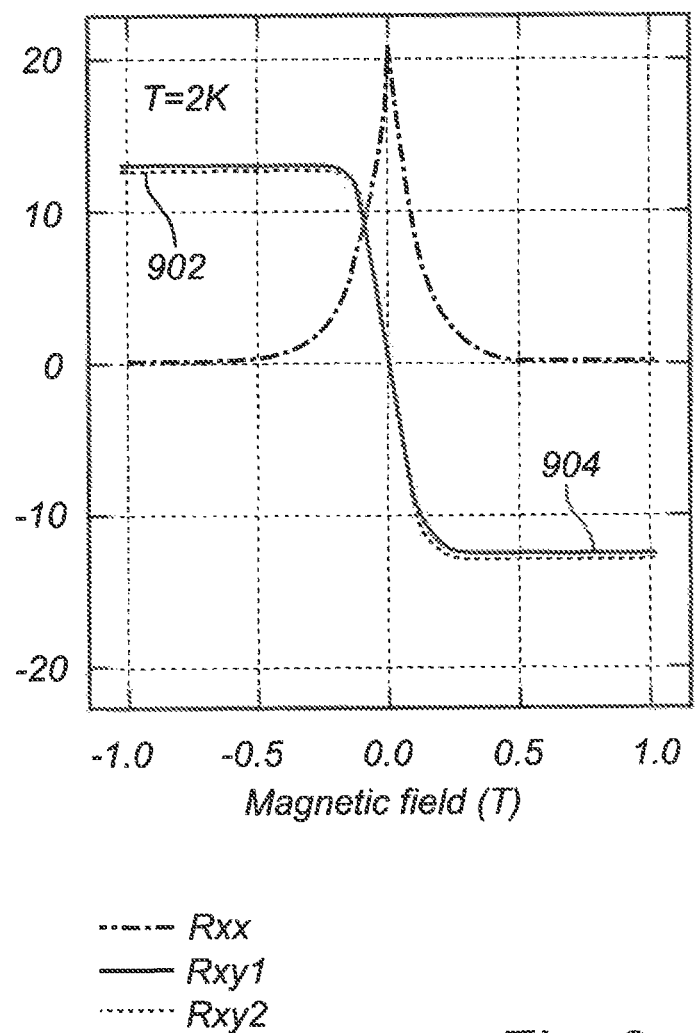
FIG. 9 shows longitudinal resistance and transverse resistance versus applied magnetic field for an electronic device as the one shown in FIG. 8.

FIG. 9 is a graph showing the longitudinal resistance (Rxx) measured between connection pads 706 and 710 of the Hall bar 701 in FIG. 8, and also the transverse resistance (Rxy1, Rxy2) measured between connection pads 706 and 708. For the chemically doped devices such as the hall bar 701, magneto-transport measurements at T=2K in the Hall bar (W=30 µm×L=100 µm) device 701 comprising the spacer layer 106 and molecular doping layer 112 show a linear transversal resistance (Rxy1, Rxy2) for magnetic fields |B|<80 mT, after which quantum Hall plateaus 902, 904 start to develop and acquire their exactly quantized value Rxy=h/2e$^2$ at |B|>300 mT (h is the Planck's constant). The magnetic field is applied perpendicular to the plane of the Hall bar 700.

With further reference to FIG. 9 which additionally shows the longitudinal resistance Rxx as a function of applied magnetic field (B). An additional test of charge carrier homogeneity within the measured regions of the Hall bar 700 is the observation of fully developed quantum Hall effect (indicated by plateaus 902, 904), with the simultaneous observation of Rxx=0 and quantized plateau in Rxy=h/2e2. Under quantizing conditions, observation of finite Rxx is in fact determined by the magnitude of disorder in the sample, which can manifest as oscillations in Rxx once the Rxy plateaus are reached (see e.g. "Transport in two-dimensional disordered semimetals," Phys. Rev. Lett., vol. 113, no. 18, pp. 1-5, 2014, or "Puddle-Induced Resistance Oscillations in the Breakdown of the Graphene Quantum Hall Effect," Phys. Rev. Lett., vol. 117, no. 23, pp. 1-5, 2016).

Accordingly, the aforementioned magneto-transport characteristics indicate that chemically doped samples with PMMA spacer and F4TCNQ dopant layer behave as systems with a single electronic band and spatially homogenous carrier density across the two-dimensional material 104.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A method for assembling dopant molecules on a surface of a two-dimensional material formed on a substrate, the method comprises:
    forming a spacer layer comprising at least one of an electrically insulating compound or a semiconductor compound on the surface of the two-dimensional material,
    subsequent to forming the spacer layer on the surface of the two-dimensional material, depositing the dopant molecules on a surface of the spacer layer opposite the surface of the two-dimensional material,
    annealing the substrate with spacer layer and the dopant molecules at an elevated temperature for an annealing time duration, wherein the temperature and annealing time are such that at least a portion of the dopant molecules are allowed to diffuse through the compound of the spacer layer towards the surface of the two-dimensional material to assemble on the surface of the two-dimensional material to thereby dope the two-dimensional material.

2. The method according to claim 1, comprising:
    after the dopant molecules have been deposited on the spacer layer, encapsulating the spacer layer with at least one encapsulating layer comprising an electrically insulating compound.

3. The method according to claim 2, comprising:
depositing at least one metal layer on the encapsulating layer.

4. The method according to claim 1, wherein the electrically insulating compound in the spacer layer is a polymer, wherein the annealing temperature is above a glass transition temperature of the electrically insulating polymer.

5. The method according to claim 1, wherein the annealing time and annealing temperature is based on a desired degree of doping of the two-dimensional material.

6. The method according to claim 1, wherein forming the spacer layer comprises:
coating a layer of two-dimensional material on the substrate with a liquid comprising an electrically insulating polymer, and
annealing the coated substrate comprising the two-dimensional material for a second time duration at a temperature above a glass transition temperature of the electrically insulating polymer to form the spacer layer on the two-dimensional material.

7. The method according to claim 6, wherein the liquid comprising the electrically insulating polymer is spin-coated onto the two-dimensional material on the substrate.

8. The method according to claim 1, wherein forming the spacer layer comprises depositing an electrically insulating polymer by at least one of physical vapor deposition or chemical vapor deposition.

9. The method according to claim 1, wherein depositing the dopant molecules on the spacer layer comprises:
coating the spacer layer with a liquid solution comprising an electrically insulating polymer and the dopant molecules.

10. The method according to claim 9, further comprising encapsulating the spacer layer with at least one encapsulating layer comprising an electrically insulating compound.

11. The method according to claim 10, comprising depositing a metal layer on the at least one encapsulating layer formed on the spacer layer.

12. The method according to claim 9, wherein the liquid solution comprising the electrically insulating polymer and the dopant molecules is spin-coated onto the spacer layer.

13. The method according to claim 1, wherein the spacer layer encapsulates the two-dimensional material on the substrate.

* * * * *